US012622318B2

(12) United States Patent
Chainer et al.

(10) Patent No.: US 12,622,318 B2
(45) Date of Patent: May 5, 2026

(54) WAFER TO WAFER HIGH DENSITY INTERCONNECTS

(71) Applicant: INTERNATIONAL BUSINESS MACHINES CORPORATION, Armonk, NY (US)

(72) Inventors: Timothy J. Chainer, Putnam Valley, NY (US); Mark D. Schultz, Ossining, NY (US); Russell A. Budd, North Salem, NY (US); Todd Edward Takken, Brewster, NY (US); Matthew Doyle, Chatfield, MN (US)

(73) Assignee: International Business Machines Corporation, Armonk, NY (US)

( * ) Notice: Subject to any disclaimer, the term of this patent is extended or adjusted under 35 U.S.C. 154(b) by 594 days.

(21) Appl. No.: 17/564,170

(22) Filed: Dec. 28, 2021

(65) Prior Publication Data

US 2023/0207523 A1     Jun. 29, 2023

(51) Int. Cl.
H01L 25/065     (2023.01)
H01L 23/00     (2006.01)
H01L 23/498     (2006.01)

(52) U.S. Cl.
CPC .... H01L 25/0655 (2013.01); H01L 23/49822 (2013.01); H01L 24/24 (2013.01); (Continued)

(58) Field of Classification Search
CPC  H01L 25/0655; H01L 23/49822; H01L 24/24
See application file for complete search history.

(56) References Cited

U.S. PATENT DOCUMENTS 7,671,449 B2     3/2010  Zingher et al.
7,969,009 B2     6/2011  Chandrasekaran
(Continued)

FOREIGN PATENT DOCUMENTS

CN        103000563 A     3/2013
EP        B 257 078 A1    12/2017
(Continued)

OTHER PUBLICATIONS

International Search Report and Written Opinion issued Apr. 24, 2023 in related international application No. PCT/EP2022/077814, 24 pgs.
(Continued)

*Primary Examiner* — Nathan W Ha
(74) *Attorney, Agent, or Firm* — CHIP LAW GROUP

(57)     ABSTRACT
An integrated circuit package provides a high bandwidth interconnect between wafers using a very high density interconnect using a silicon bridge or a multi-layer flex between wafers. In some embodiments, more than one wafer may be mounted and connected with a rigid silicon bridge onto a common substrate. This common substrate can be matched, with respect to their coefficients of thermal expansion (CTE), to the silicon wafer. The CTE matched substrate can reduce the thermal mechanical stress on the wafers and the rigid silicon bridge interconnect. In some embodiments, a thinned silicon bridge is utilized to interconnect wafers which are mounted on separate glass substrates. The thinned bridge would allow for mechanical compliance between the wafers. In some embodiments, the wafers can be mounted onto separate glass substrates and attached with a fine pitch multi-layer flex structure which provides compliance between the wafers.

20 Claims, 8 Drawing Sheets

(52) U.S. Cl.
    CPC ............... *H01L 2224/24137* (2013.01); *H01L 2224/2512* (2013.01)

(56) References Cited

U.S. PATENT DOCUMENTS

| | | | |
|---|---|---|---|
| 9,368,450 | B1 | 6/2016 | Gu et al. |
| 9,443,824 | B1 * | 9/2016 | We ...................... H01L 23/3114 |
| 9,548,264 | B2 | 1/2017 | Roy et al. |
| 10,784,202 | B2 | 9/2020 | Arguin et al. |
| 10,991,635 | B2 | 4/2021 | McHerron et al. |
| 11,049,830 | B2 * | 6/2021 | Marquart ................. H01L 24/81 |
| 11,410,971 | B2 | 8/2022 | Tseng et al. |
| 11,545,438 | B2 * | 1/2023 | Hsieh ........................ H01L 24/20 |
| 2004/0006883 | A1 * | 1/2004 | Wu ................... H01L 21/67775 |
| | | | 33/645 |
| 2007/0043894 | A1 | 2/2007 | Zingher et al. |
| 2011/0042824 | A1 | 2/2011 | Koide |
| 2013/0026609 | A1 * | 1/2013 | Wu ................... H01L 23/49827 |
| | | | 257/632 |
| 2015/0364422 | A1 * | 12/2015 | Zhai ...................... H01L 21/768 |
| | | | 257/773 |
| 2016/0066422 | A1 | 3/2016 | Sakamoto |
| 2016/0379959 | A1 * | 12/2016 | We ...................... H01L 23/3114 |
| | | | 257/773 |
| 2018/0077801 | A1 | 3/2018 | Kulick et al. |
| 2019/0164806 | A1 * | 5/2019 | Leobandung .......... H01L 24/03 |
| 2020/0258838 | A1 * | 8/2020 | Ghosh ................. H01L 23/5381 |
| 2020/0273803 | A1 | 8/2020 | Hsu |
| 2020/0357744 | A1 | 11/2020 | Yong et al. |
| 2021/0020389 | A1 | 1/2021 | Henke et al. |
| 2021/0020529 | A1 | 1/2021 | Mcherron |
| 2021/0050318 | A1 * | 2/2021 | Marquart ............ H01L 25/0655 |
| 2021/0134724 | A1 * | 5/2021 | Rubin ................. H01L 23/5385 |
| 2021/0202389 | A1 | 7/2021 | Hsieh |
| 2021/0320040 | A1 * | 10/2021 | Fu ........................ H01L 25/0655 |
| 2022/0084969 | A1 * | 3/2022 | Colgan ................. H01L 23/544 |
| 2022/0157727 | A1 * | 5/2022 | Farooq ............... H01L 23/5385 |
| 2022/0359483 | A1 * | 11/2022 | Hung ...................... H01L 25/50 |
| 2022/0406752 | A1 * | 12/2022 | Wang ................. H01L 23/3185 |
| 2023/0051337 | A1 * | 2/2023 | Horibe ................. H01L 21/561 |
| 2023/0187430 | A1 * | 6/2023 | Funaki ................... H01L 25/18 |
| | | | 257/618 |
| 2024/0332276 | A1 * | 10/2024 | Funaki ............... H01L 25/0655 |

FOREIGN PATENT DOCUMENTS

| | | |
|---|---|---|
| TW | I722959 B | 3/2022 |
| TW | I844901 B | 6/2024 |
| TW | 202429669 A | 7/2024 |
| WO | 2023/126086 A1 | 7/2023 |

OTHER PUBLICATIONS

Suhard, S. et al., "Demonstration of a Collective Hybrid Die-to-Wafer Integration Using Glass Carrier"; IEEE 71st Electronic Components and Technology Conference (ECTC—2021); 7 pgs.

Partial International Search Report issued Feb. 10, 2023 in related international application No. PCT/EP2022/077814, 14 pgs.

\* cited by examiner

122

118    118

116    116

106    106

104    104
102    102

114    114

140

122    122

Wafer Pod    Wafer Pod    Wafer Pod
118    118    118

116    116    116

602    500    602

702

WAFER TO WAFER HIGH DENSITY INTERCONNECTS

STATEMENT REGARDING FEDERALLY SPONSORED RESEARCH OR DEVELOPMENT

This application was made with government support under contract number H98230-19-C-0113 awarded by the Maryland Procurement Office. The government has certain rights to this invention.

BACKGROUND

Technical Field

The present disclosure generally relates to semiconductor integrated circuits, and more particularly, to structures and methods for interconnecting semiconductor wafers using a silicon bridge or a multi-layer flex bridge.

Description of the Related Art

In the packaging of integrated circuits, there are scenarios where it may be beneficial to interconnect semiconductor wafers in a side-by-side packaging configuration. A semiconductor wafer includes multiple die sites fabricated on the frontside on the wafer including "Back End of the Line" (BEOL) wiring levels to provide external connections to the die sites. A semiconductor wafer may include redistribution layers (RDL) on either the frontside or backside of the wafer to provide additional wiring levels. A semiconductor wafer may also include through silicon vias (TSVs), which provide electrical connections between the frontside the frontside and backside of the wafer.

In one configuration, semiconductor wafers can be packaged with the backside of the wafer bonded mounted onto a package substrate. The wafer may be mounted onto a microchannel cooler to remove the heat dissipated from wafer. The package substrate provides mechanical support and provide coolant connections to the microchannel cooler.

SUMMARY

According to various embodiments, a structure and method are provided for interconnecting wafers with a high density interconnect structure. Such a high density connection can include a silicon bridge, a thinned silicon bridge and a multi-layer flex bridge.

In one embodiment, a wafer scale system includes two or more wafers each mounted on a substrate. A silicon bridge connects adjacent ones of the two or more wafers, where the silicon bridge provides a signal line pitch of less than about 1 micron.

In some embodiments, the two or more wafers are mounted on a shared substrate. A coefficient of thermal expansion (CTE) of the two or more wafers can be matched to a CTE of the substrate.

In some embodiments, the silicon bridge is a thinned silicon bridge providing a flexible interconnection between the adjacent ones of the two of more wafers. The wafers may be mounted on a shared substrate or may be mounted independently on distinct and separate substrates.

In on embodiment, semiconductor wafers are mounted with the backside of the wafer mounted on a shared or separate substrate In one embodiment, semiconductor wafers with TSV's are mounted with the frontside of the wafer mounted on a shared or separate substrate.

In one embodiment, wafers may be mounted with the frontside of at least one wafer and the backside of at least one wafer on a shared or separate substrate.

According to various embodiments, a wafer scale system includes two or more wafers each packaged in a respective wafer pod. A multilayer flex structure connects to each of the two or more wafers, where the multilayer flex structure terminates in a connector. The connector is operable to connect with an adjacent connector of an adjacent wafer pod. The multilayer flex structure can provide a signal line pitch of less than about 10 micron and be comprised of more than one layer.

In some embodiments, two of more multilayer flex structures connects one of the two or more wafer pods with the adjacent wafer pod.

In some embodiments, each wafer pod includes one or more of the connectors at each face thereof, providing operability to connect the wafer pod to up to four adjacent wafer pods for a rectilinear arrangement or up to 6 wafer pods if the pods are hexagonal and configured in a hexagonal close packed (HCP) arrangement.

By virtue of the concepts discussed herein, the structure and methods provided herein improve upon approaches currently used to interconnect wafers.

These and other features will become apparent from the following detailed description of illustrative embodiments thereof, which is to be read in connection with the accompanying drawings.

BRIEF DESCRIPTION OF THE DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all the components or steps that are illustrated. When the same numeral appears in different drawings, it refers to the same or like components or steps.

DETAILED DESCRIPTION

Overview

Figure 1A:
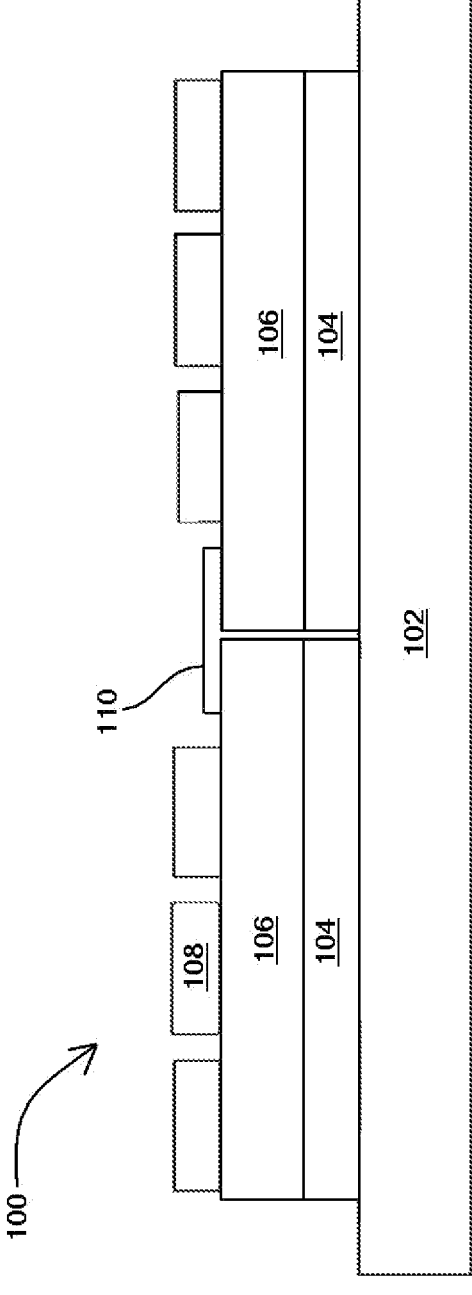
FIG. 1A is a schematic representation of a frontside wafer to wafer interconnect using a silicon bridge, consistent with an illustrative embodiment.

In the following detailed description, numerous specific details are set forth by way of examples to provide a thorough understanding of the relevant teachings. However, it should be apparent that the present teachings may be practiced without such details. In other instances, well-known methods, procedures, components, and/or circuitry have been described at a relatively high-level, without detail, to avoid unnecessarily obscuring aspects of the present teachings.

Unless specifically stated otherwise, and as may be apparent from the following description and claims, it should be appreciated that throughout the specification descriptions utilizing terms such as "processing," "computing," "calculating," "determining," or the like, refer to the action and/or processes of a computer or computing system, or similar electronic computing device, that manipulate and/or transform data represented as physical, such as electronic, quantities within the computing system's registers and/or memories into other data similarly represented as physical quantities within the computing system's memories, registers or other such information storage, transmission or display devices.

Broadly, embodiments of the present disclosure provides an integrated circuit package that provides a high bandwidth interconnect between wafers using a very high density interconnect structure by using a silicon bridge or a multi-layer flex between wafers. As used herein, a "high density" interconnect structure may have a signal line pitch below about 1 micron. Such high density interconnect structures can provide a "high bandwidth" interconnection between wafers.

The number of interconnects is determined by the signal line pitch and number of signal layers of the high density interconnect structure. The signal lines terminate on bonding pads on the interconnect structure which are bonded to mating bonding pads on the wafer. The wafer frontside includes active devices and BEOL wiring levels which connect the wafer bonding pads to die sites on the wafer. Optionally the wafer frontside or backside may include Redistribution Layers (RDL) to provide additional wiring connections between the wafer die sites and wafer bonding pads. The high density interconnect structure may include multiple rows of pads for connection to mating pads on the wafer. The interconnect structure pads are bonded to mating pads on the wafer using for example either a controlled collapse chip connection (C4) solder connection or copper to copper bonding. In the case of a C4 bond, the pad pitch can be as low as 10 micron. In the case of a copper to copper bond between a silicon interconnect structure and the wafer, the bonding pad pitch can be as low as 1 micron. The bandwidth of the interconnect structure will depend upon but not limited to line pitch, dielectric constant, signal line copper thickness, copper roughness and number of wiring layers.

In another configuration, the active device region or frontside of the wafer is facing the package mounting substrate. In this configuration through silicon vias (TSVs) connect the active devices on the frontside of the wafer to the backside of the wafer. RDL wiring layers on the wafer backside provide connection between the TSVs to the high density interconnect structure, which provides a signal path to the active devices on the wafer frontside.

In some embodiments, more than one wafer may be mounted and connected with a rigid silicon bridge onto a common substrate. This common substrate can be matched, with respect to their coefficients of thermal expansion (CTE), to the silicon wafer. The CTE matched substrate can reduce the thermal mechanical stress on the wafers and the rigid silicon bridge interconnect. The silicon bridge would provide a high density signal line pitch below 1 micron.

In some embodiments, a thinned silicon bridge is utilized to interconnect wafers bonded to microchannels are mounted on separate glass substrates. The thinned silicon bridge would allow for mechanical compliance between the wafers. The thinned silicon bridge can also provide a signal line pitch below 1 micron. Each wafer may have more than one thinned silicon bridge to adjacent wafers.

In some embodiments, the wafers can be mounted onto separate glass substrates and attached with a fine pitch multi-layer flex structure which provides compliance between the wafers. The line pitch is higher than a silicon bridge but provides for multiple signal layers. Typically, a fine pitch may have a signal line pitch below about 10 micron. Typically a multi-layer flex may have up to 8 signal layers.

In some embodiment, the wafer may be attached to a microchannel cooler to remove heat from the wafer by flowing a coolant through the microchannel cooler. The wafer and microchannel cooler assembly is mounted onto a substrate to provide both coolant connection and mechanical stability.

In some embodiments, the backside of a wafer may be mounted to a substrate.

In some embodiments, the frontside of a wafer, which includes TSVs, may be mounted on a substrate. The TSV's provide electrical connection for signal and power to the die sites on the frontside of the wafer.

In some embodiments, the integrated circuit package for a wafer scale system may include frontside and backside mounted wafers on common or separate substrates.

In some embodiments, a subsection of a wafer may be connected with a high density interconnect structure.

In some embodiments, arrays of wafers may be connected with a high density interconnect structure.

In some embodiments, laminates are attached to the wafer to provide power and/or communications to the wafer.

FIG. 1A illustrates an integrated circuit package 100 for a wafer scale system where more than one wafer 106 may be mounted with the backside of the wafer onto a common substrate 102. The active or frontside of the wafers 106 can be connected with a rigid silicon bridge 110 (also referred to as a silicon bridge high density interconnect structure 110). In some embodiments, one or more silicon bridges 110 may be used to interconnect adjacent wafers 106. The integrated circuit package 100 may include a two-dimensional array of interconnected wafers 702 (see FIG. 7) formed in any desired size, depending on the particular application. Depending on the requisite bandwidth needed between the wafers 106, two or more silicon bridges 110 may be used to interconnect two adjacent wafers 106.

In some embodiments, a cooling structure, such as a microchannel cooler 104, may be provided between the wafers 106 and the substrate 102. The substrate 102 would provide external fluidic connections and distribution to the microchannel cooler.

In some embodiment a plurality of laminates 108 can be applied to the wafer 106. The laminates may provide external connections for power and communications to the wafer 106.

The substrate 102 may be, for example, a glass substrate which is CTE matched to silicon. The CTE matched substrate 102 can reduce the thermal mechanical stress on the wafers 106 and rigid silicon bridge interconnect 110. The silicon bridge 110 can provide a high density signal line pitch below 1 micron.

Figure 1B:
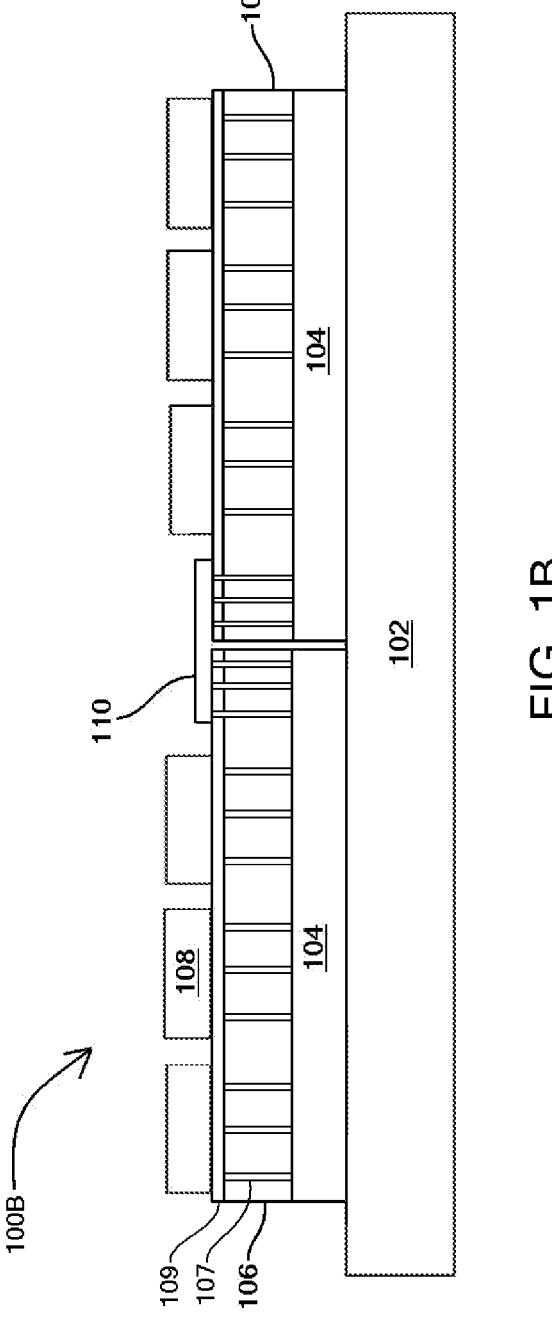
FIG. 1B is a schematic representation of a backside wafer to wafer interconnect with through silicon vias and redistribution layers using a silicon bridge consistent with an illustrative embodiment.

FIG. 1B illustrates an integrated wafer package system 100B where more than one wafer 106 may be mounted with the frontside of the wafer onto a common substrate 102. The die sites on the frontside of the wafers 106 are connected with through silicon vias 107 (TSVs) to the backside of the wafer. RDL layers 109 on the wafer backside connect the TSV 107 to the silicon bridge 110.

Figure 1C:
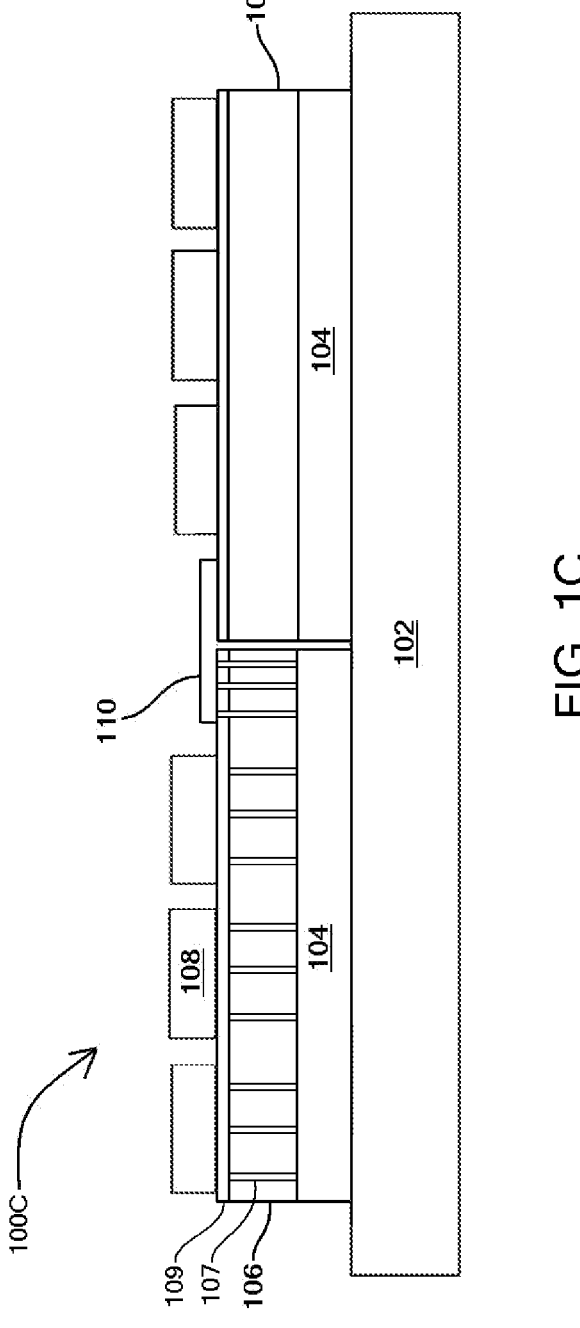
FIG. 1C is a schematic representation of a backside wafer to frontside wafer interconnect using a silicon bridge, consistent with an illustrative embodiment.

FIG. 1C illustrates an integrated wafer package system 100C where more than one wafer 106 may be mounted with either the backside or frontside of the wafer to a common substrate.

Figure 2:
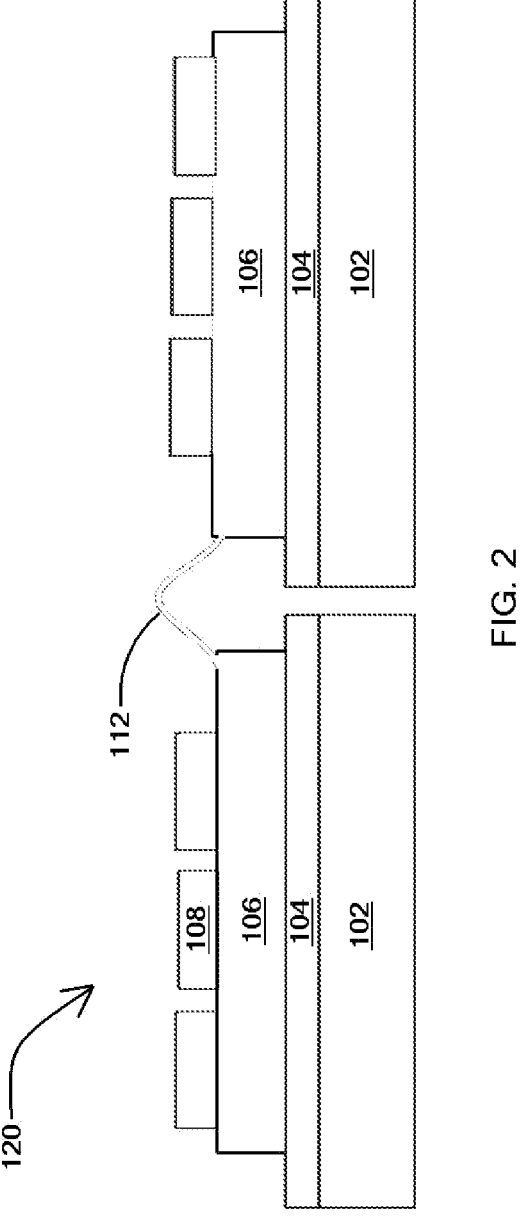
FIG. 2 is a schematic representation of a wafer to wafer interconnect using a thinned silicon bridge, consistent with an illustrative embodiment.

FIG. 2 provides an integrated circuit package 120 for a wafer scale system where each wafer 106 of a plurality of wafers can be mounted on its own substrate 102. A thinned silicon bridge 112 can be utilized to interconnect wafers 106, which are mounted on separate glass substrates 102. The thinned silicon bridge 112 would allow for mechanical compliance between the wafers, thus not requiring a matching CTE between the substrate 102 and the wafer 106. The thinned silicon bridge 112 also provides signal line pitch below 1 micron. In some embodiments, the thinned silicon bridge 112 may be attached to the wafers 106 after being thinned. A handler (not shown) may be used to assist in placement and attachment of the thinned silicon bridge 112 to the wafers 106. The integrated circuit package 120 may include a two-dimensional array of interconnected wafers formed in any desired size, depending on the particular application [702].

Figures 3, 4:
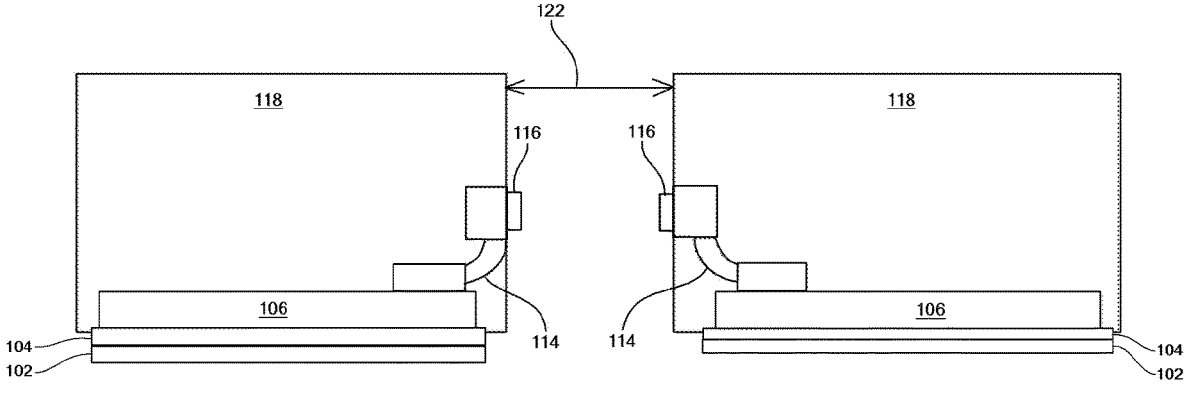
FIG. 3 is a schematic representation of a wafer to wafer interconnect using a multilayer flex bridge, consistent with an illustrative embodiment.
FIG. 4 is a perspective view of multiple wafer pods to be connected by the wafer to wafer interconnect using the multilayer flex bridge of FIG. 3.

Referring now to FIGS. 3 and 4, adjacent wafer pods 118 in which a wafer, mounted on a substrate 102 can be designed to connect to each other with a connector 116 provided on each of the wafer pods 118. The wafer may be mounted on a microchannel cooler 104 to remove heat generated from the wafer. The connector 116 can include a fine pitch multi-layer flex structure 114, which provides compliance between the wafer pods 118. As used herein, a "fine pitch" multi-layer flex structure 114 can provide a line pitch of less than about 10 micron. The multi-flex structure however flex can be comprised of multiple, typically up to eight, wiring layers. The result is a removable connection, as indicated by arrow 122.

Each wafer pod 118 can include a plurality of connectors 116, as illustrated in FIG. 4. While FIG. 4 shows two connectors 116 on each side of the wafer pod 118, allowing two multi-layer flex structures 114 to join adjacent wafer pods 118, various number of interconnections may be established between a pair of wafers within adjacent wafer pods 118.

Figure 5:
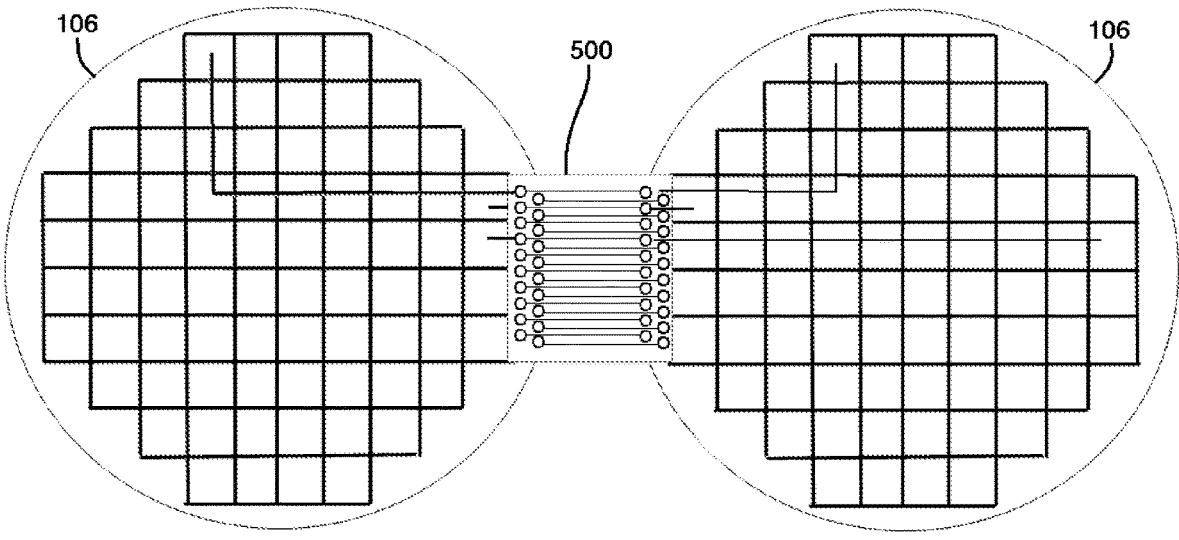
FIG. 5 is a schematic representation of a wafer to wafer high density interconnect structure connection between wafer die sites.

Referring now to FIG. 5, the high density interconnect structure 500, which may be a silicon bridge, thinned silicon bridge or multi-layer flex, includes signal wires which terminate on pads. The pads of the high density interconnect structure 500 are bonded to mating pads on the wafer 106. The wafer bonding pads are connected to the wafer die sites using wiring levels provided by either the BEOL or RDL wiring levels. The interconnect structure 500 and wafer wiring levels provide data signal lines between die sites on different wafers.

Figure 6:
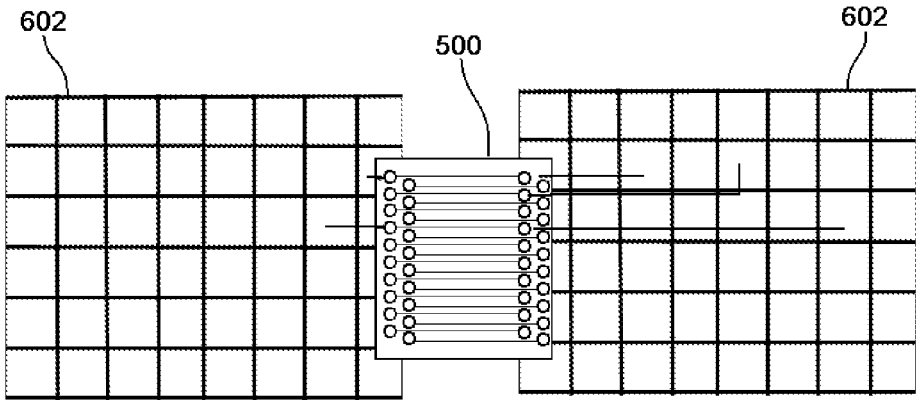
FIG. 6 is a schematic representation of a wafer subsection to wafer subsection high density interconnect structure between wafer subsection die sites.

Referring now to FIG. 6, the high density interconnect structure 500 may be used to connect subsections of wafers 602.

Figure 7:
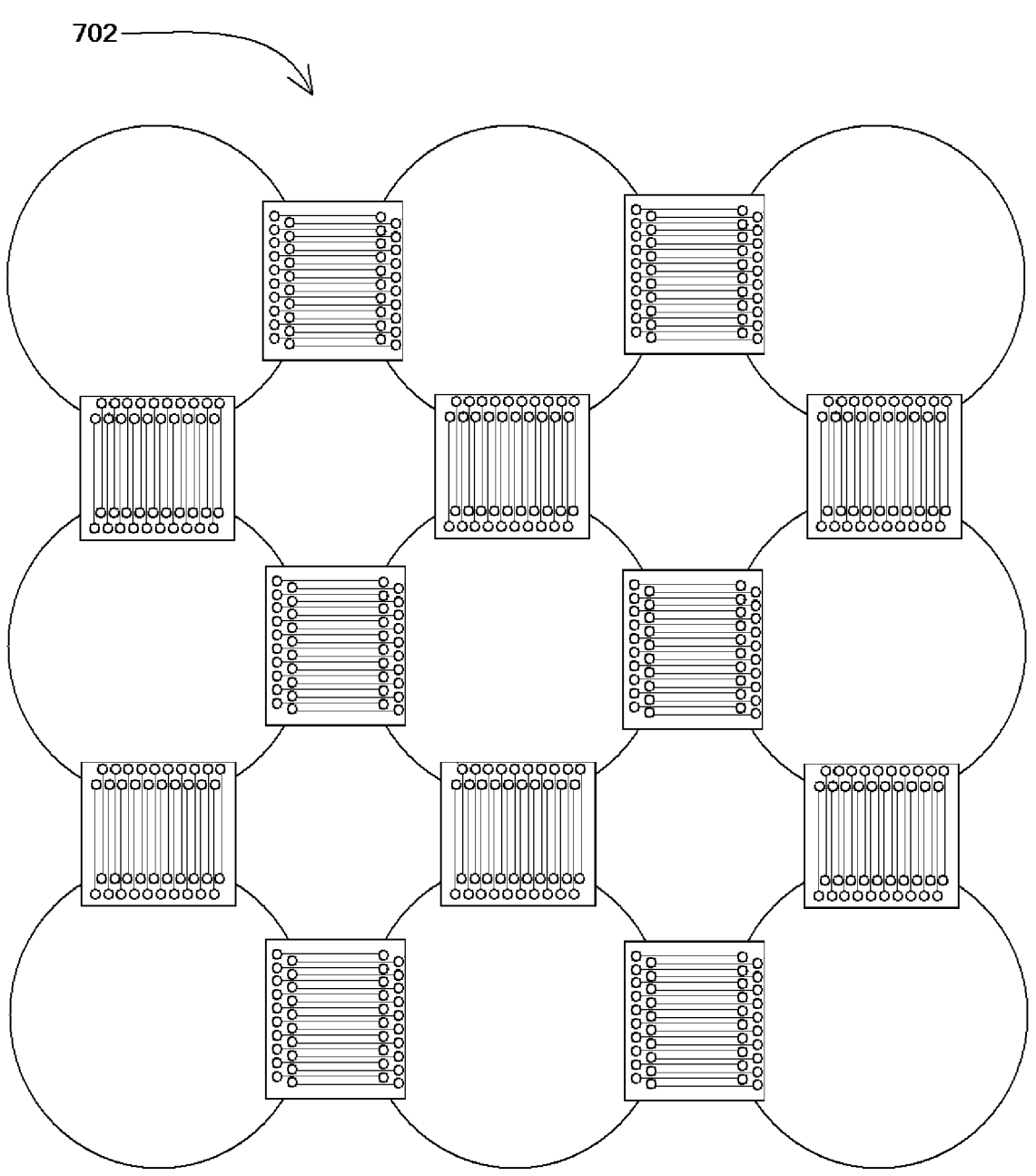
FIG. 7 is a schematic representation of an array of wafers connected with high density interconnect structures.

Referring now to FIG. 7, the high density interconnect structures may be used connect wafers in a grid array 702 by providing connections between adjacent wafers.

Conclusion

The descriptions of the various embodiments of the present teachings have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While the foregoing has described what are considered to be the best state and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications, and variations that fall within the true scope of the present teachings.

The components, steps, features, objects, benefits, and advantages that have been discussed herein are merely illustrative. None of them, nor the discussions relating to them, are intended to limit the scope of protection. While various advantages have been discussed herein, it will be understood that not all embodiments necessarily include all advantages. Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

Numerous other embodiments are also contemplated. These include embodiments that have fewer, additional, and/or different components, steps, features, objects, benefits and advantages. These also include embodiments in which the components and/or steps are arranged and/or ordered differently.

Aspects of the present disclosure are described herein with reference to a flowchart illustration and/or block diagram of a method, apparatus (systems), and computer program products according to embodiments of the present disclosure.

While the foregoing has been described in conjunction with exemplary embodiments, it is understood that the term "exemplary" is merely meant as an example, rather than the best or optimal. Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments have more features than are expressly recited in each claim. Rather, as the following claims reflect, the inventive subject matter lies in less than all features of a single disclosed embodiment. Thus, the following claims are hereby incorporated into the Detailed Description, with each claim standing on its own as a separately claimed subject matter.

What is claimed is:

1. A wafer scale system, comprising:
a plurality of wafers mounted on a substrate, wherein
the plurality of wafers comprises a first wafer and a second wafer,
the first wafer is adjacent to the second wafer, and
each of the first wafer and the second wafer comprises a plurality of die sites; and
a high density interconnect structure that comprises a plurality of signal wires, wherein each signal wire of the plurality of signal wires connects one or more die sites of the plurality of die sites of the first wafer to one or more die sites of the plurality of die sites of the second wafer.

2. The wafer scale system of claim 1, wherein the high density interconnect structure is a silicon bridge.

3. The wafer scale system of claim 2, wherein two or more wafers of the plurality of wafers are mounted on a shared substrate.

4. The wafer scale system of claim 3, wherein a coefficient of thermal expansion (CTE) of the two or more wafers is matched to a CTE of the substrate.

5. The wafer scale system of claim 2, wherein the silicon bridge includes two or more silicon bridges to connect the one or more die sites of the plurality of die sites of the first wafer to the one or more die sites of the plurality of die sites of the second wafer.

6. The wafer scale system of claim 2, wherein the silicon bridge provides a signal line pitch of less than about 1 micron.

7. The wafer scale system of claim 1, wherein
the high density interconnect structure is a thinned silicon bridge, and
the thinned silicon bridge provides a flexible interconnection between the one or more die sites of the plurality of die sites of the first wafer to the one or more die sites of the plurality of die sites of the second wafer.

8. The wafer scale system of claim 7, wherein each wafer of the plurality of wafers is independently mounted on a distinct and separate substrate.

9. The wafer scale system of claim 7, wherein the thinned silicon bridge provides a signal line pitch of less than 1 micron.

10. The wafer scale system of claim 1, wherein:
each wafer of the plurality of wafers is disposed in a respective wafer pod of a plurality of wafer pods,
a first wafer pod, of the plurality of wafer pods, includes a multilayer flex structure that terminates in a first connector of a plurality of connectors,
the first wafer pod is adjacent to a second wafer pod of the plurality of wafer pods,
the first connector is adjacent to a second connector of the plurality of connectors, and
the first connector is configured to connect with the second connector of the second wafer pod.

11. The wafer scale system of claim 10, wherein;
two or more multilayer flex structures connect the first wafer pod with the second wafer pod, and
the two or more multilayer flex structures include the multilayer flex structure.

12. The wafer scale system of claim 10, wherein each multilayer flex structure of two or more multilayer flex structures provides a signal line pitch of less than 10 microns.

13. The wafer scale system of claim 1, further comprising a cooling structure disposed between each wafer of the plurality of wafers and the substrate.

14. The wafer scale system of claim 1, wherein;
a frontside of one or more wafers of the plurality of wafers has through silicon vias, and
the one or more wafers are mounted onto the substrate.

15. The wafer scale system of claim 14, where a backside of the one or more wafers of the plurality of wafers includes redistribution layers to connect to the high density interconnect structure.

16. A wafer scale system, comprising:
two or more wafers mounted on a substrate, wherein
the two or more wafers comprise a first wafer and a second wafer,
the first wafer is adjacent to the second wafer, and
each of the first wafer and the second wafer comprises a plurality of die sites; and
a silicon bridge that comprises a plurality of signal wires, wherein each signal wire of the plurality of signal wires connect one or more die sites of the plurality of die sites of the first wafer to one or more die sites of the plurality of die sites of the second wafer, wherein
the silicon bridge provides a signal line pitch of less than 1 micron.

17. The wafer scale system of claim 16, wherein:
the two or more wafers are mounted on a shared substrate, and
a coefficient of thermal expansion (CTE) of the two or more wafers is matched to a CTE of the shared substrate.

18. The wafer scale system of claim 16, wherein:
the silicon bridge is a thinned silicon bridge,
the thinned silicon bridge provides a flexible interconnection between the one or more die sites of the plurality of die sites of the first wafer and the one or more die sites of the plurality of die sites of the second wafer, and

each wafer of the two or more wafers is independently mounted on a distinct and separate substrate.

19. A wafer scale system, comprising:

two or more wafers each packaged in a first wafer pod of a plurality of wafer pods, wherein the two or more wafers comprise a first wafer and a second wafer, the first wafer is adjacent to the second wafer, and each of the first wafer and the second wafer comprises a plurality of die sites;

a silicon bridge that comprises a plurality of signal wires, wherein each signal wire of the plurality of signal wires connect one or more die sites of the plurality of die sites of the first wafer to one or more die sites of the plurality of die sites of the second wafer; and a multilayer flex structure connected to each wafer of the two or more wafers, wherein the multilayer flex structure terminates in a first connector of a plurality of connectors, wherein the first wafer pod is adjacent to a second wafer pod of the plurality of wafer pods, the first connector is adjacent to a second connector of the plurality of connectors, the first connector is configured to connect with the second connector of the second wafer pod, and the multilayer flex structure provides a signal line pitch of less than 10 micron.

20. The wafer scale system of claim 19, wherein:

each wafer pod, of the plurality of wafer pods, includes one or more connectors of the plurality of connectors at each face, the one or more connectors connect the first wafer pod to four wafer pods of the plurality of wafer pods, and each wafer pod of the four wafer pods is adjacent to the first wafer pod.

* * * * *